(12) United States Patent
Vimercati

(10) Patent No.: US 11,705,185 B2
(45) Date of Patent: Jul. 18, 2023

(54) APPARATUS FOR DIFFERENTIAL MEMORY CELLS

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/362,280

(22) Filed: Jun. 29, 2021

(65) Prior Publication Data

US 2022/0415381 A1    Dec. 29, 2022

(51) Int. Cl.

| | |
|---|---|
| G11C 7/00 | (2006.01) |
| G11C 11/4091 | (2006.01) |
| G11C 11/408 | (2006.01) |
| G05F 3/26 | (2006.01) |
| G11C 5/06 | (2006.01) |
| G11C 11/4074 | (2006.01) |

(52) U.S. Cl.
CPC .......... *G11C 11/4091* (2013.01); *G05F 3/262* (2013.01); *G11C 5/063* (2013.01); *G11C 11/4074* (2013.01); *G11C 11/4085* (2013.01)

(58) Field of Classification Search
CPC ................................................ G11C 11/4091
See application file for complete search history.

(56) References Cited

U.S. PATENT DOCUMENTS

| | | | |
|---|---|---|---|
| 6,205,071 B1 | 3/2001 | Ooishi | |
| 2005/0135143 A1* | 6/2005 | Jeon | G11C 11/22 365/145 |
| 2006/0028890 A1* | 2/2006 | Lee | G11C 11/22 365/189.11 |
| 2009/0089646 A1 | 4/2009 | Hirose et al. | |
| 2012/0127776 A1* | 5/2012 | Kawashima | G11C 7/065 365/145 |
| 2017/0316833 A1 | 11/2017 | Ihm et al. | |
| 2018/0033478 A1 | 2/2018 | Tanaka et al. | |
| 2018/0059958 A1 | 3/2018 | Ryan et al. | |
| 2018/0068735 A1* | 3/2018 | Hirose | G11C 29/50004 |
| 2018/0122455 A1* | 5/2018 | Yamada | G11C 7/06 |

OTHER PUBLICATIONS

"International Search Report and Written Opinion of the International Searching Authority," issued in connection with Int'l Appl. No. PCT/US2022/073035, dated Sep. 30, 2022 (9 pages).

* cited by examiner

*Primary Examiner* — Min Huang
(74) *Attorney, Agent, or Firm* — Holland & Hart LLP

(57) ABSTRACT

Methods, systems, and devices for apparatus for differential memory cells are described. An apparatus may include a pair of memory cells comprising a first memory cell and a second memory cell, a word line coupled with the pair of memory cells and a plate line coupled with the pair of memory cells. The apparatus may further include a first digit line coupled with the first memory cell and a sense amplifier and a second digit line coupled with the second memory cell and the sense amplifier. The apparatus may include a select line configured to couple the first digit line and the second digit line with the sense amplifier.

23 Claims, 7 Drawing Sheets

APPARATUS FOR DIFFERENTIAL MEMORY CELLS

FIELD OF TECHNOLOGY

The following relates generally to one or more systems for memory and more specifically to apparatus for differential memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
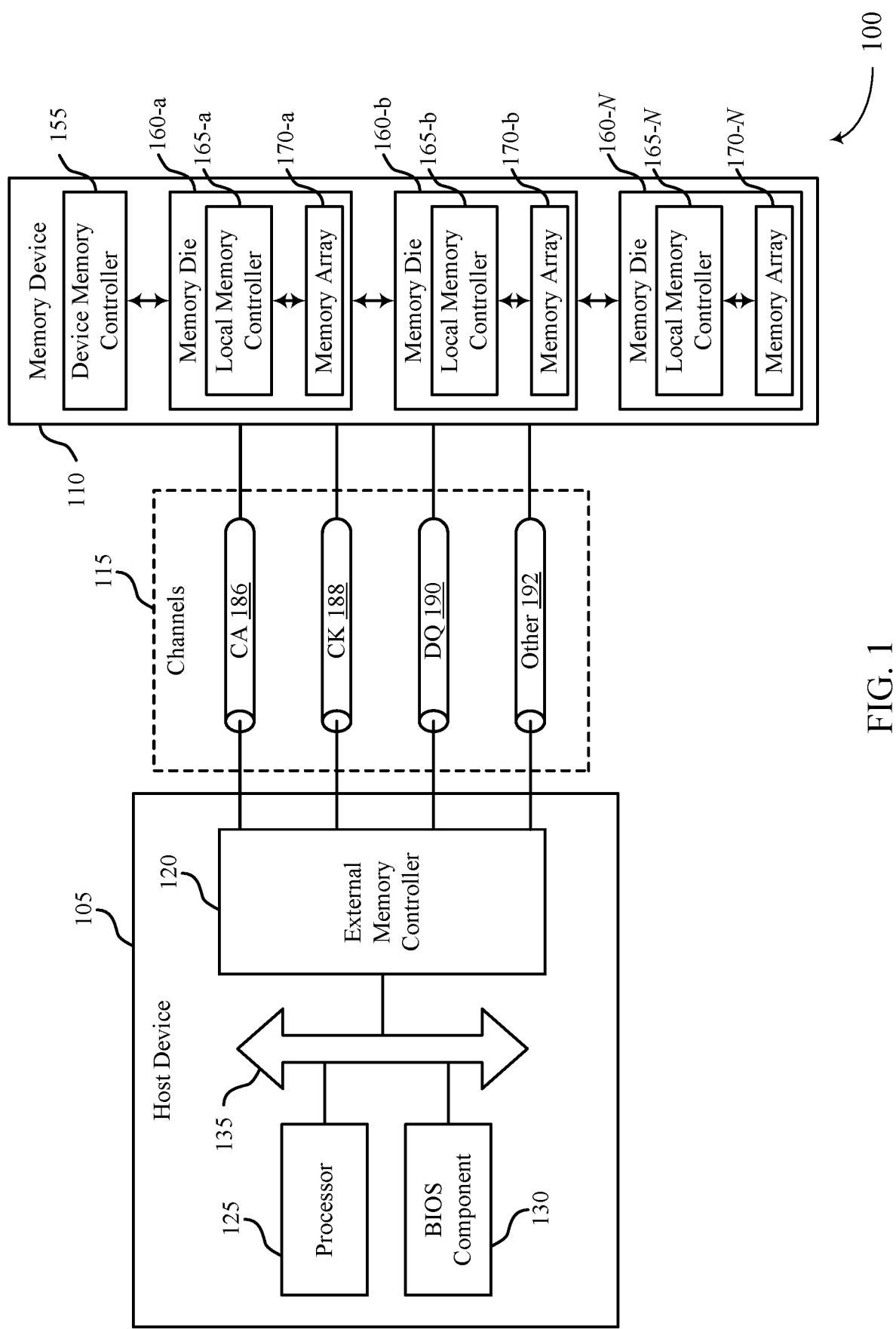
FIG. 1 illustrates an example of a system that supports apparatus for differential memory cells in accordance with examples as disclosed herein.

A memory device may include a memory array or memory die to store data. In some examples, the memory device may store a logic state to a memory cell in the memory array. For example, the memory device may apply a first voltage to store a first logic state or apply a second voltage to store a second logic state to the memory cells. In some examples, due to manufacturing and physical characteristic deviations, a threshold voltage of one memory cell storing a logic state may be different than a threshold voltage of another memory cell storing the same logic state. Accordingly, memory cells within an array that each store a given logic state may be associated with a range or distribution of respective threshold voltages. In some examples, a distribution of threshold voltages for memory cells storing the first logic state may overlap with a distribution for memory cells storing the second logic state. In such examples, applying a reference voltage to determine if a memory cell is storing a first logic state or a second logic state may be difficult—e.g., the reference voltage may be below a lowest threshold voltage of a memory cell storing the first logic state and above a highest threshold voltage of a memory cell storing the second logic state. This may cause inaccurate sensing of memory cells in the memory device. Additionally, in such examples, the memory device may have an architecture that includes a sense amplifier (e.g., sense component) coupled with each digit line (e.g., access line or bit line) of the memory array. In such examples, the physical size of the memory array may increase to include some or all of the sense amplifiers.

Systems, techniques, and devices are described herein for an apparatus for differential memory cells in a memory device, such as a column decoder architecture for differential memory cells. In some examples, the memory device may include pairs of memory cells coupled with a shared plate line to store a single logic state—e.g., two memory cells may store a single bit of information or data. In such examples, the memory device may include a sense amplifier configured to sense a logic state based on a difference between a voltage of a first memory cell of the pair of memory cells and a voltage of a second memory cell of the pair of memory cells. Additionally, each pair of memory cells may be coupled with a pair of local digit lines—e.g., a first digit line coupled with the first memory cell and a second digit line coupled with the second memory cell. In such examples, each local digit line pair (e.g., digit lines coupled directly with the pair of memory cells) maybe coupled with a pair of global digit lines (e.g., digit lines coupled directly with the sense amplifier). Accordingly, the memory device may reduce a quantity of sense amplifiers compared with other examples. The memory device may also include a column decoder that is configured to couple a selected local digit line pair with the plate line and with the pair of global digit lines to transfer a voltage from each memory cell to the sense amplifier. By utilizing differential memory cells, the memory device may improve sensing capabilities and decrease time associated with a sense operation.

Features of the disclosure are initially described in the context of systems and dies as described with reference to FIG. 1. Features of the disclosure are described in the context memory arrays and timing diagrams as described with reference to FIGS. 2-7.

FIG. 1 illustrates an example of a system 100 that supports sensing techniques for differential memory cells in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with a pair of memory cells being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, memory array 170 may comprise a pairs of memory cells that are configured to store one bit of data. That is, a first memory cell and a second memory cell of the pair of memory cells may be configured to store one bit of data. In such examples, the pair of memory cells may share a common plate line. Each memory cell pair may be coupled with a pair of digit lines—e.g., a first digit line coupled with the first memory cell and a second digit line coupled with the second digit line. In some examples, a sense component may receive a voltage from the first digit line and the second digit line and determine a logic state stored at the pair of memory cells based on a difference between the two voltages. By having two memory cells store a bit of data, the memory device 110 may decrease sensing inaccuracies. Additionally, memory device 100 may utilize sensing techniques to reduce a duration to perform a sensing technique, to conserve power, and/or to reduce imprinting effects on the memory cells.

Figure 2:
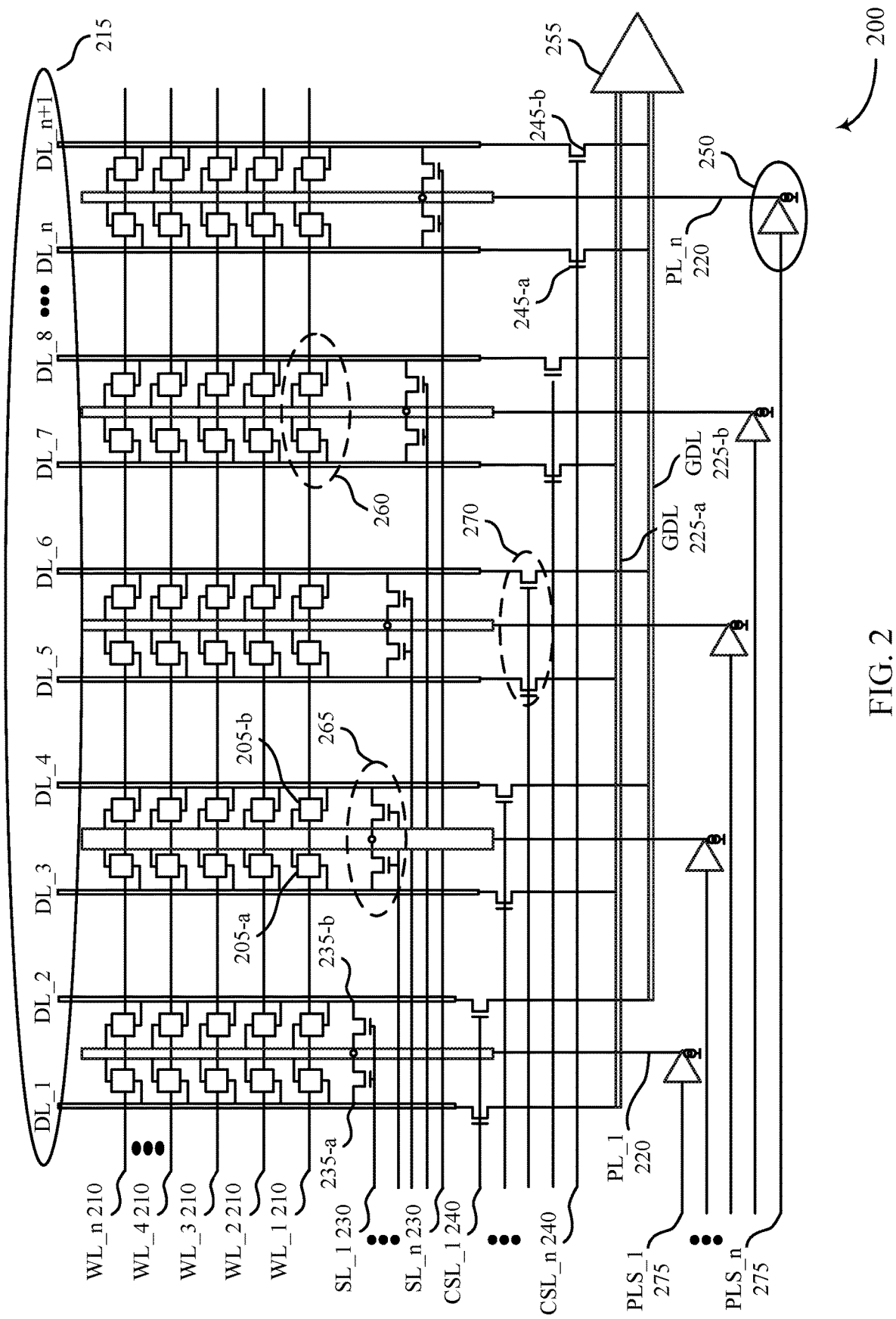
FIG. 2 illustrates an example of a memory array that supports apparatus for differential memory cells in accordance with examples as disclosed herein.

FIG. 2 illustrates an example of a memory array 200 that supports apparatus for differential memory cells in accordance with examples as disclosed herein. The memory array 200 may be an example of memory arrays 170 as described with reference to FIG. 1. In some examples, the memory array 200 may be referred to as a memory die, a memory chip, a memory device, or an electronic memory apparatus. The memory array 200 may include one or more memory cells 205, word lines 210, local digit lines 215, plate lines 220, and global digit lines (GDL) 225. In some examples, the memory array 200 may include a column decoder comprising shunt lines (SL) 230 and column select lines (CSL) 240. The memory array 200 may include plate select lines (PSL) 265 (e.g., from a plate line driver). The memory array 200 may also include a sense component 255.

In FeRAM and hybrid FeRAM architectures, the memory cell 205 may include a capacitor that includes a ferroelectric material to store a charge and/or a polarization representative of a programmable state. The memory cell 205 may include a logic storage component, such as capacitor, and a switching component (e.g., a selection component). Each memory cell 205 may be coupled with a digit line 215 and a plate line 220. Additional details regarding the architecture of a memory cell 205 is described with reference to FIG. 3.

The memory array 200 may include one or more memory cells 205 that each may be programmable to store different logic states (e.g., a programmed one of a set of two or more possible states). For example, the memory cell 205 may store a state (e.g., polarization state or dielectric charge) representative of the programmable states in a capacitor. In some examples, the memory array 200 may program a memory cell 205 to a logic state based on a voltage applied to the memory cell. In such examples, distribution of threshold voltages for memory cells 205 storing one logic state may overlap with a distribution of threshold voltages for memory cells 205 storing another logic state. That is, because of manufacturing and physical characteristic deviations, a threshold voltage of one memory cell 205 storing a logic state may be different than a threshold voltage of another memory cell 205 storing the same logic state—e.g., a first memory cell 205 storing a logic state '1' may have a different threshold voltage than a second memory cell 205 also storing the logic state '1'. Thus, the memory cells 205 within the memory array 200 that each store a given logic state may be associated with a range or distribution of respective threshold voltages.

In such examples, sensing a memory cell 205 storing a single bit of data may be challenging. That is, in some examples a sense component 255 (e.g., sense amplifier) may determine a logic state of a memory cell 205 by using a reference voltage—e.g., the sense component 255 may determine a first logic state of the memory cell 205 if a voltage from the memory cell 205 is less than the reference voltage and determine a second logic state of the memory cell 205 if a voltage from the memory cell is greater than the reference voltage. The reference voltage, however, may be in between an overlap between an uppermost threshold voltage of the distribution for a first logic state and below a bottommost threshold of the distribution for a second logic state. Accordingly, the sense component 255 may inaccurately determine a memory cell 205 has the second logic state when the memory cell 205 has a threshold voltage at the uppermost threshold voltage of the distribution for the first logic state or determine a memory cell 205 has the first logic state when the memory cell 205 has a threshold voltage at the bottommost threshold of the distribution for a second logic state.

A pair of memory cells 260 (e.g., a memory cell 205-*a* and a memory cell 205-*b*) may be configured to store one bit of information—e.g., sensing the pair of memory cells 260 may sense one bit of information. In such examples, the sense component 255 may be configured to determine a logic state associated with the pair of memory cells 260 based on a difference between a voltage of a first memory cell 205-*a* and a voltage of a second memory cell 205-*b* of the pair of memory cells. For example, a logic first memory cell 205-*a* may be programmed to a first logic state and the second memory cell 205-*b* may be programmed to an opposite second logic state and the sense component 255 may determine the logic state associated with the pair of memory cells 260 based on a difference between the first memory cell 205-*a* logic state and the second memory cell 205-*b* logic state. Because the sense component 255 is determining the logic state based on the pair of memory cells 260, the likelihood of inaccurate sensing is decreased. That is, it is unlikely the first memory cell 205-*a* has a threshold voltage at the uppermost threshold voltage distribution for the first logic state and the second memory cell 205-*b* has a threshold voltage at the lowermost threshold voltage distribution for the second logic state. Additionally, in some examples, the differential sensing of a pair of memory cells 260 may be faster than compared to other examples.

The memory array 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210 and the digit lines 215. In some examples, a pair of memory cells 260 may share a plate line 220. For example, memory cell 205-*a* and memory cell 205-*b* may be coupled with a same plate line 220. Additionally, each pair of memory cells 260 may be coupled with a pair of digit lines 215. For example, a third digit line (DL_3) 215 coupled with memory cell 205-*a* and a fourth digit line (DL_4) 215 coupled with memory cell 205-*b* may be referred to as a pair of digit lines or digit line pairs. In some examples, digit lines 215 may also be referred to as local digit lines—e.g., digit lines coupled with the memory cells 205. Memory array 200 may further include global digit lines 225—e.g., digit lines coupled with the sense component 255 and local digit lines 215. For example, global digit line 225-*a* may be coupled to a first digit line 215 of each pair of digit lines—e.g., global digit line 225-*a* may be coupled to the third digit line 215-*a*. Global digit line 225-*b* may be coupled to a second digit line 215 of each pair of digit line—e.g., global digit line 225-*b* may be coupled with the fourth digit line 215. Digit lines 215 may be configured to transmit charge from a pair of memory cells 260 to the global digit lines 225. The global digit lines 225 may be configured to transmit the charge received from the digit lines 215 to the sense component 255. By utilizing a sense component for a plurality of digit lines 215 rather than a sense component for each digit line 215, the memory array 200 may conserve area compared with other examples.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a pair of memory cells 260 may be accessed. Activating or selecting a word line 210, a digit line 215, or a plate line 220 may include applying a voltage to the respective line.

Accessing the memory cells 205 may be controlled through a row decoder, a column decoder, and a plate driver. For example, a row decoder may receive a row address from a local memory controller and activate a word line 210 based on the received row address. A column decoder receives a column address from the local memory controller and activates a pair of digit lines 215 based on the received column address.

In some examples, the column decoder may further comprise shunt lines 230 and column select lines 240. Shunt lines 230 may be coupled to a pair of transistors 265 (e.g., transistor pairs or shunt transistors). For example, a first shunt line (SL_1) 230 may be coupled to a transistor pair 265 comprising a first transistor 235-*a* and a second transistor 235-*b*. In some examples, the shunt lines 230 may be configured to activate or deactivate the pair of transistors 265 based on whether an access operation is being performed. For example, the pair of transistors 265 may be configured to equalize a voltage between the pair of digit lines, pair of memory cells 260, and plate line 220 when activated—e.g., when an access operation is not associated with the memory cell pair 260 and a signal driven by a shunt line 230 is low. For example, the first transistor 235-*a* and second transistor 235-*b* may be configured to equalize a voltage between a first digit line (DL 1) 215, a first plate (PL_1) 220 and a second digit line (DL_2) 215 such that a voltage across a pair of memory cells 260 coupled with the first digit line 215 and the second digit line 215 is unchanged when activated. For example, if the first word line 210 is activated to select a first memory pair 260 (e.g., a memory pair 260 coupled with the third digit line 215 and the fourth digit line 215), the transistors 235-*a* and 235-*b* may be activated to negate an effect of the first word line 210 being activated on unselected memory cells (e.g., pairs of memory cells 260 coupled with the first digit line 215 and the second digit line 215). Additionally, the pair of transistors 265 may be configured to be deactivated when the shunt line 230 drives a high signal—e.g., when a pair of memory cells 260 is associated with an access operation. In some examples, when the pair of transistors 265 are deactivated, the plate line 220 may be isolated from the digit lines 215—e.g., the first plate line 220 may be isolated from the first digit line 215 and the second digit line 215.

In some examples, select lines (e.g., column select lines) 240 may be configured to activate a pair of transistors 270 to couple a pair of local digit lines 215 to the pair of global digit lines 225 based on whether an access operation is being performed. For example, a second select line 240 may be configured to activate a transistor pair 270 and couple the third digit line 215 and the fourth digit line 215 to the global digit line 225-*a* and global digit line 225-*b*, respectively, if an access operation is being performed on memory cell 205-a and memory cell 205-b. Each pair of transistors 270 may include a first transistor 245-a and a second transistor 245-b. The first transistor 245-a may be coupled with a first digit line 215 of a digit line pair and the second transistor 245-b may be coupled with a second digit line 215 of the digit line pair. In some examples, the select line 240 and the shunt line 230 may share a common signal—e.g., the logic value of the signal communicated on both the select line 240 and the shunt line 230 may be the same.

In some examples, a plate driver may receive a plate address from the local memory controller and activates a plate line 220 based on the received plate address. For example, the plate driver may drive a first plate select line (PLS) to activate the first plate 220. In some examples, the plate select line may be coupled with the plate line via a circuit 250. In some examples, the circuit 250 may be a current mirror configuration. In other examples, circuit 250 may be a resistive transistor configuration. The circuit 250 may be an example of a bleeder circuit. That is, the circuit 250 may be configured to draw current from a ground voltage when coupled with the plate line 220—e.g., an effect of a charge from an activated word line may be reduced on an untargeted memory cell by the circuit 250. For example, if the plate line 220 was directly coupled with and driven to a ground voltage while deactivated, an untargeted memory cell 205 may experience a voltage across—e.g., the plate line 220 voltage may be forced to ground while the voltage at the memory cell 205 may change based on the activated word line. With the circuit 250, the plate line 220 voltage may adjust based on the voltage of the word line 210—e.g., the voltage across the memory cell 205 may remain at or close to zero (0) volts. Accordingly, the circuit 250 may reduce disturb on memory cells 205—e.g., reduce the likelihood the activation of the word line 210 may affect the state of the memory cell 205.

The sense component 255 may be configured to receive a state (e.g., a polarization state, a voltage, or a charge) from each memory cell 205 of the memory cell pair 260 and determine a logic state of the pair of memory cells 260 based on a difference in the received states—e.g., based on a difference between the voltage of the first memory cell 205-a and the second memory cell 205-b. The sense component 250 may include one or more sense amplifiers to amplify the signal output of the memory cell pair 260. The detected logic state of the memory cell pair 260 may be provided as an output of the sense component 250 (e.g., to an input/output component), and may indicate the detected logic state to another component of a memory device 110 that includes the memory array 200.

In some examples, the memory array 200 may also include a local controller (not shown). The local controller may be operable to perform one or more access operations on one or more memory cell pairs 260 of the memory array 200. Examples of access operations may include a write operation, a read operation, a refresh operation, a precharge operation, or an activate operation, among others. The local memory controller may be operable to perform other access operations not listed here or other operations related to the operating of the memory array 200 that are not directly related to accessing the memory cell pairs 260. Additional details described with activating and applying voltages to the word lines 210, digit lines 215, plate lines 220, shunt lines 230, and select lines 240 is described with reference to FIGS. 5-7.

Figure 3:
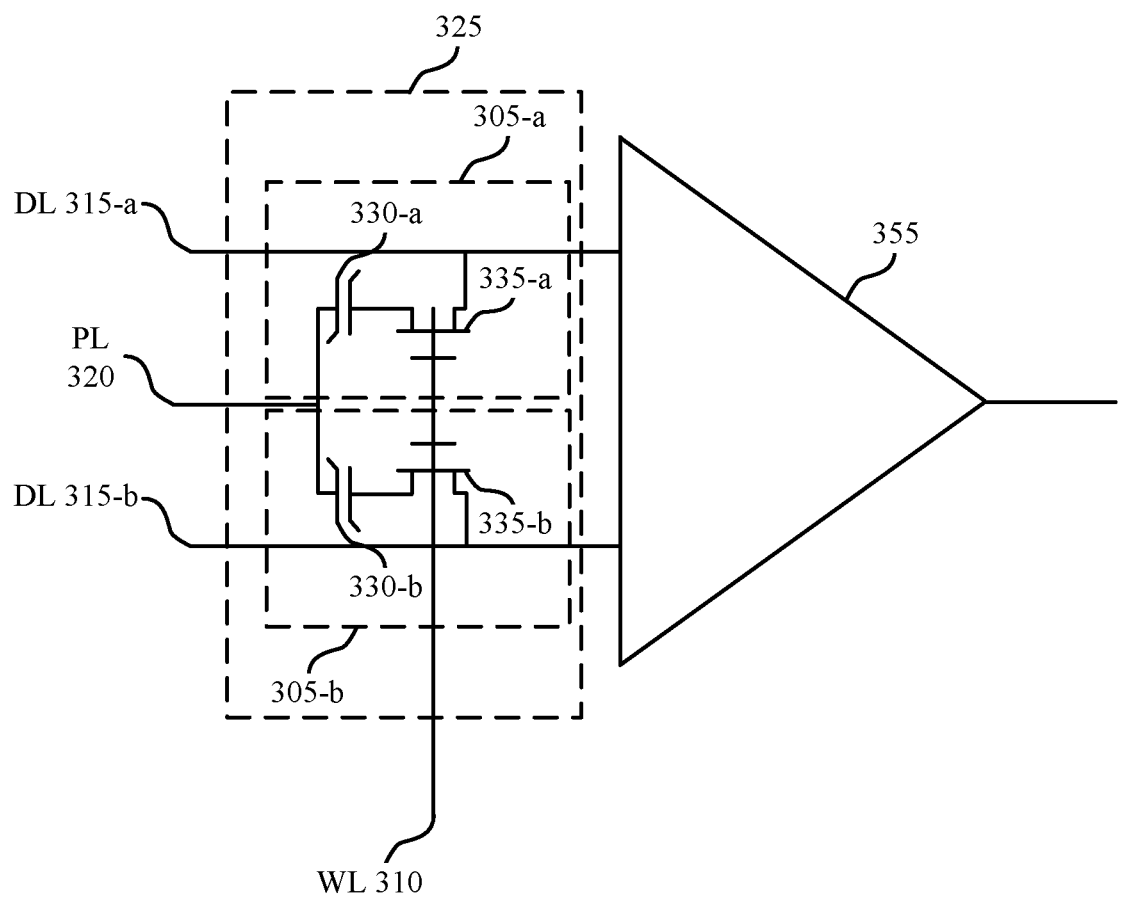
FIG. 3 illustrates an example of a memory array that supports apparatus for differential memory cells in accordance with examples as disclosed herein.

FIG. 3 illustrates an example of a memory array 300 that supports apparatus for differential memory cells in accordance with examples as disclosed herein. Memory array 300 may be an example of memory array 200 as described with reference to FIG. 2. Memory array 300 include examples of components as described with reference to FIG. 2. For example, the memory array 300 may include a memory cell pair 325, a memory cell 305, a word line 310, a digit line 315, a plate line 320, and a sense component 355 which may be examples of a memory cell 260, a memory cell 205, a word line 210, a digit line 215, a plate line 220, and a sense component 255 as described with reference to FIG. 2. In some examples, digit line 315 may also be examples of a global digit line 225 as described with reference to FIG. 2—e.g., the digit line 315 may be coupled to the memory cells 305 and the sense amplifier 355 to illustrate how a memory cell 305 is coupled with the sense component 355.

A memory cell 305 may include a logic storage component, such as capacitor 330, and a switching component 335. The capacitor 330 may be an example of a ferroelectric capacitor. A first node of the capacitor 330 may be coupled with the switching component 335 and a second node of the capacitor 330 may be coupled with a plate line 320. In some examples, a memory cell pair 325 may comprise a single plate line 320. That is, memory cell 305-a and memory cell 305-b may both be coupled to the same plate line 320. In such examples, the memory cell pair 325 may be configured to store one bit of information or data. Additionally or alternatively, memory cell 305-a and memory cell 305-b may be configured to store opposite logic states or charges—e.g., if memory cell 305-a stores a logic value '1', memory cell 305-b may store a logic value '0'. The switching component 335-a may be an example of a transistor or any other type of switch device that selectively establishes or de-establishes electronic communication between two components.

Selecting or deselecting the memory cell 305 may be accomplished by activating or deactivating the switching component 335. The capacitor 330 may be in electronic communication with the digit line 315 using the switching component 335. For example, the capacitor 330 may be isolated from digit line 315 when the switching component 335 is deactivated, and the capacitor 330 may be coupled with digit line 315 when the switching component 335 is activated.

In some examples, the switching component 335 may be activated by a word line 310. A word line 310 may be configured to activate a memory cell pair 325 by activating a switching component 335-a of memory cell 305-a and a switching component 335-b of memory cell 305-b. In such examples, the memory cell pair 325 may be coupled with a digit line pair—e.g., memory cell 305-a may be coupled with digit line 315-a and memory cell 315-b may be coupled with digit line 315-b.

Sense component 355 may be configured to sense a logic state of memory cell pair 325 by determining a difference in a voltage of the memory cell 305-a and the memory cell 305-b. That is, when the switching components 335-a and 335-b are activated by the word line 310, memory cell 305-a may transfer charge from the capacitor 330-a to the digit line 315-a and memory cell 305-b may transfer charge form the capacitor 330-b to the digit line 315-b. In such examples, the sense component 355 may receive a first charge or first voltage from digit line 315-a associated with memory cell 305-a and a second charge of second voltage from the digit line 315-b associated with memory cell 305-b. The sense component 355 may then determine a logic state of the memory cell 305-a based on a difference between the first charge or first voltage and the second charge or second voltage e.g., if memory cell 305-a has a greater charge than memory cell 305-b the sense component 355 may determine a logic state '1' for the memory cell pair 325 and if the memory cell 305-b has a greater charge than memory cell 305-a the sense component may determine a logic state '0' for the memory cell pair 325. Because the sense component 355 determines a logic state based on both the first memory cell 305-a and the second memory cell 305-b, a likelihood of inaccurate sensing due to an uppermost voltage of a first logic state distribution being greater than a lowermost voltage of a second logic state voltage may be reduced. In a differential system (such as the memory cell pair 325), sources of interference or errors are likely to affect the signals from both memory cells the same way. In contrast, in a single-ended system (e.g., with a single memory cell), sources of interference or errors may affect the signal from the memory cell differently than they affect the reference signal, thereby causing mismatches that may cause one or more errors.

Figure 4:
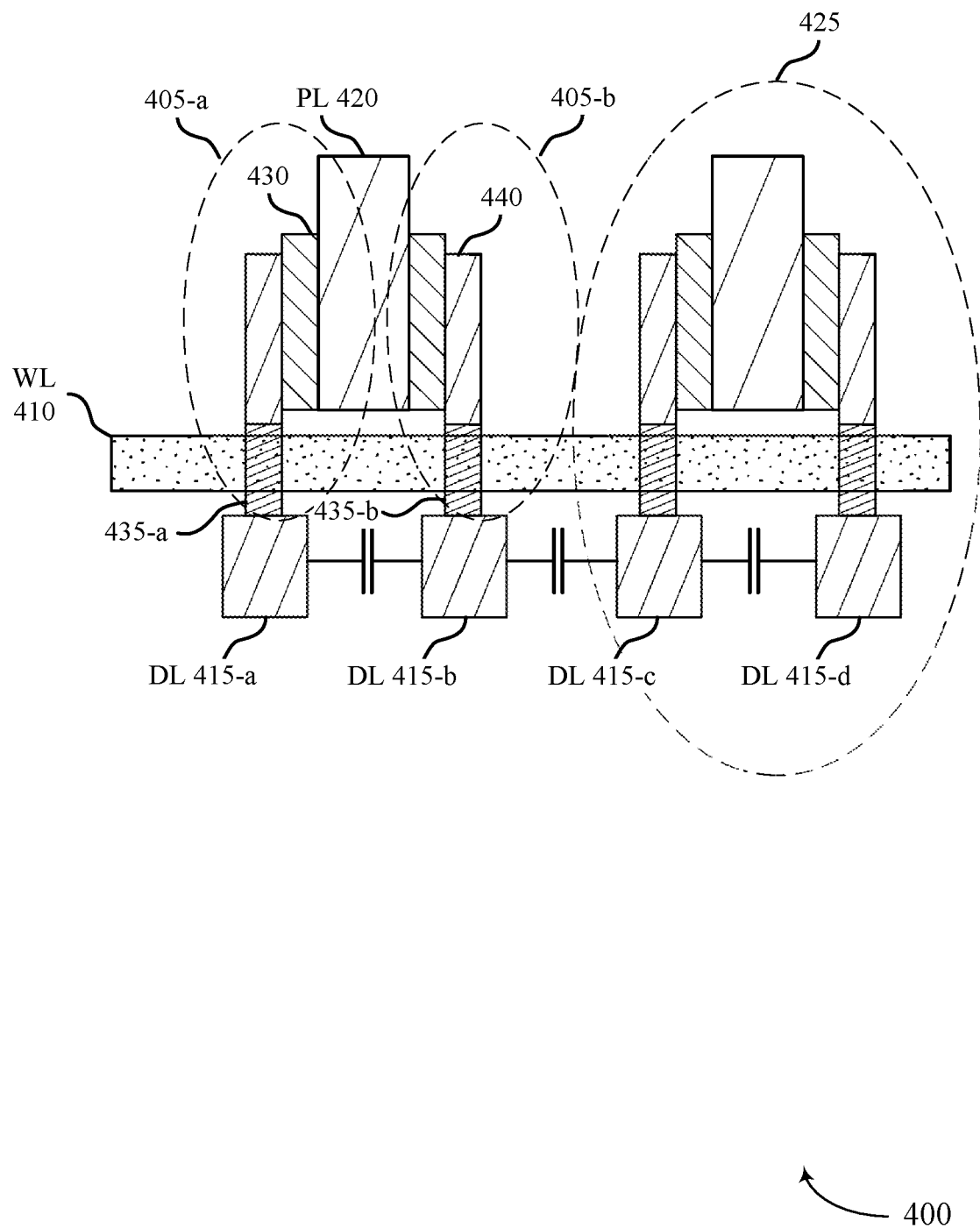
FIG. 4 illustrates an example of a memory array that supports apparatus for differential memory cells in accordance with examples as disclosed herein.

FIG. 4 illustrates an example of a memory array 400 that supports apparatus for differential memory cells in accordance with examples as disclosed herein. Memory array 400 may be an example of memory array 200 and 300 as described with reference to FIGS. 2 and 3. Memory array 400 include examples of components as described with reference to FIG. 2. For example, the memory array 400 may include a memory cell pair 425, a memory cell 405, a word line 410, a digit line 415, and a plate line 420, which may be examples of a memory cell pair 265, a memory cell 205, a word line 210, a digit line 215, a plate line 220, and a sense component 255 as described with reference to FIG. 2. In some examples, the digit line 415 and plate line 420 may extend into and out of the page.

A memory cell pair 425 may include a first memory cell 405-a and a second memory cell 405-b each coupled with a common plate line 420—e.g., the memory cell pair 425 may store one bit of information. Each memory cell 405 may include a logic storage component 430 (e.g., a capacitor 330 as described with reference to FIG. 3) such as an FeRAM oxide. Memory cells 405 may further comprise metal conductive lines 440 coupling the logic storage element 430 with a switching component 435 (e.g., a switching component 335 as described with reference to FIG. 3).

Each memory cell pair 425 may be coupled with a digit line pair—e.g., memory pair 425 may be coupled with a first digit line 415-a and a second digit line 415-b. The memory cell pair 420 may also be coupled with a word line 410. The word line 410 may activate the switching components 435 of a memory cell pair (e.g., switching component 435-a and switching component 435-b) to couple a respective memory cell pair 425 with the digit line pair. In some examples, the digit lines 415 may be coupled with a global digit line (e.g., global digit line 225 as described with reference to FIG. 2) or a sense component (e.g., sense component 255 as described with reference to FIG. 2). By storing one bit of information in a memory cell pair 425, the memory array 400 may reduce inaccurate sensing errors and reduce a duration to perform a sensing operation.

Figure 5:
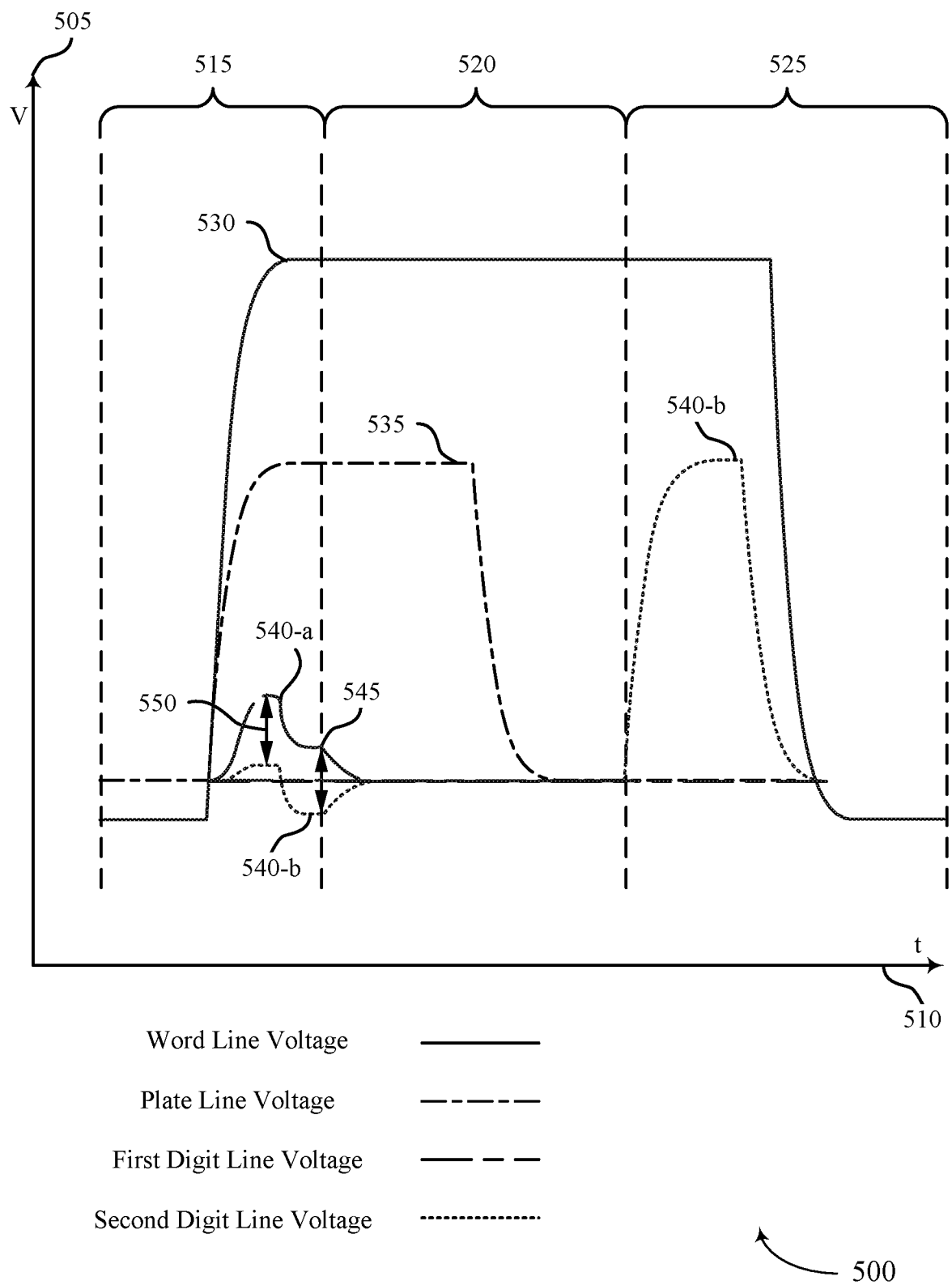
FIG. 5 illustrates an example of a timing diagram that supports apparatus for differential memory cells in accordance with examples as disclosed herein.

FIG. 5 illustrates an example of a timing diagram 500 that supports apparatus for differential memory cells in accordance with examples as disclosed herein. Timing diagram 500 includes a voltage axis 505 and a time axis 510 and may represent at least a portion of a read operation and a writeback operation. The voltages of various components as a function of time are also represented on timing diagram 500. For example, timing diagram includes a word line voltage 530, a plate line voltage 535, a first digit line voltage 540-a and a second digit line voltage 540-b.

By way of example, word line voltage 530 may represent a voltage at a word line (e.g., word line 210 as described with reference to FIG. 2) coupled with a memory cell pair (e.g., memory cell pair 265 as described with reference to FIG. 2). Plate line voltage 535 may represent a voltage at a plate line (e.g., plate line 220 as described with reference to FIG. 2) coupled with a first memory cell (e.g., memory cell 205-a) and a second memory cell (e.g., memory cell 205-b) of a memory cell pair. First digit line voltage 540-a may represent a voltage at a first digit line (e.g., digit line 215-a) and second digit line voltage 540-b may represent a voltage at second digit line (e.g., digit line 215-b as described with reference to FIG. 2). In some examples, the first digit line voltage 540-a and the second digit line voltage 540-b may represent a voltage at a first global digit line (e.g., global digit line 225-a) and a second global digit line (e.g., global digit line 225-b), respectively. Timing diagram 500 may result from operating memory array 200 as described with reference to FIG. 2, and the following discussion is in the context of components depicted in FIG. 2. Additionally, timing diagram 500 may illustrate a first duration 515 that is before a sensing operation occurs, a second duration 520 associated with sensing a logic state of the memory cell pair, and a third duration 525 associated with a writeback operation of one memory cell of the memory cell pair.

In some examples, a sensing technique for operating a ferroelectric memory cell pair may comprise keeping a voltage of the digit line pair high and a voltage of the plate line low during a sensing operation. In such examples, the voltages applied may cause the memory cell to move towards a logic state '0'. Such techniques are described with reference to FIGS. 6 and 7.

As described herein, a sensing technique for operating a ferroelectric memory cell pair may comprise keeping a voltage of the digit line pair low and a voltage of the plate line high during a sensing operation. In such examples, the voltages applied may cause the memory cell to move toward a logic state '1'. In some examples, memory array 200 may switch between sensing schemes described with reference to FIGS. 5-7 to reduce cell imprinting affects—e.g., writing a memory cell to a same logic state frequently may a memory cell threshold voltage to shift and make the memory cell resistant to storing a different logic state.

As discussed above, various states can be stored by a memory cell—e.g., the memory cell may store a first logic state or a second logic state. For example, a memory cell may be initialized to a first logic state or a second logic state based on applying voltage across a memory cell—e.g., a difference in a voltage between a plate line voltage and a digit line voltage of a plate line and digit line coupled with the memory cell, respectively. The application of a voltage across the memory cell may be based at least in part on activating a switching component (e.g., switching component 335 as described with reference to FIG. 3)—e.g., applying a voltage to the gate of the switching component via a word line. To read a logic state stored by the memory cell, a charge or voltage of the memory cell may be shared with a digit line. An access operation associated with a memory cell pair may comprise sharing a voltage of a first memory cell of the memory cell pair with a first digit line and sharing a voltage of a second memory cell of the memory cell pair with a second digit line. In such examples, the sense amplifier may determine the logic state of the memory cell pair based on a difference between the voltage of the first digit line and the voltage of the second digit line.

At a time 515, a local memory controller may select a memory cell pair for a read operation. In some examples, the word line voltage 530 may be applied to the word line to activate the switching component of the first memory cell and the second memory cell of the memory cell pair. It should be noted the word line voltage 530 is shown at a voltage lower than a first digit line voltage 540-*a* and a second digit line voltage 540-*b* for illustrative purposes only—e.g., the word line voltage 530 may also be at ground before the access operation. Based on the word line voltage 530 being applied, a first memory cell and a second memory cell of a memory cell pair may be selected—e.g., the switching components of the first memory cell and second memory cell may be activated. A plate selection line (e.g., plate selection line 275 as described with reference to FIG. 2) may apply a plate line voltage 535 to a plate line coupled with the first memory cell and the second memory cell. The plate line voltage 535 may be applied until it reaches a threshold voltage—e.g., a read voltage. During 515, a pair of shunt transistors (e.g., pair of transistors 265 as described with reference to FIG. 2) may be deactivated. That is, the plate line may be isolated from the first digit line and the second digit line—e.g., the plate line voltage 535 may increase independent of the first digit line voltage 540-*a* and the second digit line voltage 540-*b*. While the current plate line is being accessed, other pairs of shunt transistors for non-targeted plate lines may be activated to at least partially couple digit lines and the plate lines and reduce a likelihood of disturbances on non-targeted memory cells.

In some examples, the first digit line voltage 540-*a* and second digit line voltage 540-*b* may be at a ground voltage (e.g., VSS) before the read operation. Accordingly, based on the word line voltage 530 and plate line voltage 535 being applied to the word line and plate line, respectively, the first digit line may receive charge from the first memory cell and the digit line voltage 540-*a* may increase and the second digit line may receive charge from the second memory cell and the digit line voltage 540-*b* may increase. In some examples, to improve a sense window—e.g., a difference between the first digit line voltage 540-*a* and the second digit line voltage 540-*b*—a first capacitor coupled with the first digit line and a sense component (e.g., sense component 255 as described with reference to FIG. 2) and a second capacitor coupled with the second digit line and the sense component may be activated at 550. In such examples, the first digit line voltage 540-*a* and the second digit line voltage 540-*b* may be pulled down—e.g., the second digit line voltage 540-*b* may be pulled to a voltage below a ground voltage. In some examples, the pull down of the first digit line voltage 540-*a* and the second digit line voltage 540-*b* may occur simultaneously with the sense component being activated at 520. In some examples, the voltage on the digit lines may be shifted to fit input specifications for the sense component. During time 515, a select line (e.g., select line 240 as described with reference to FIG. 2) may go high and activate a transistor pair (e.g., transistor pair 265 as described with reference to FIG. 2) to couple the first digit line to a first global digit line and couple the second digit line to the second global digit line. In such examples, the voltage from the first memory cell (e.g., digit line voltage 540-*a*) may be transferred to the sense component via the first global digit line and the voltage from the second memory cell (e.g., digit line voltage 540-*b*) may be transferred to the sense component via the second global digit line.

At 520, the memory array may perform a sense operation (e.g., the fire the sense amplifier). For example, at 520 a sense component may be activated and receive the charge from the first global digit line and the second global digit line. The sense component may determine a logic state of the memory cell pair based on a difference 545 between the first digit line voltage 540-*a* and the second digit line voltage 540-*b*. For example, the sense component may determine a first logic state if the difference 545 between the first digit line voltage 540-*a* is and the second digit line voltage 540-*b* is positive as illustrated in FIG. 5—e.g., a logic state '1'. In other examples, the sense component may determine a second logic state if the difference 545 between the first digit line voltage 540-*a* and the second digit line 540-*b* is negative.

After the sense component has determined the logic state of the memory cell pair, the first digit line voltage 540-*a* and the second digit line voltage 540-*b* may be driven to a ground voltage. Because the plate line voltage 535 remains high and the first digit line voltage 540-*a* and the second digit line voltage 540-*b* are at ground, the voltage across the first memory cell and the second memory cell may be positive. Accordingly, both the first memory cell and the second memory cell may move towards a first logic state '1.' That is, during the time 520, the first memory cell and the second memory cell may both store a logic state '1' after the sense component has determined the logic state of the memory cell pair. In some cases, the plate line voltage 535 may be driven to the ground voltage after the first and second memory cell move towards the first logic state.

At 525, the memory array may perform a writeback operation. For example, the memory array may select either the first memory cell or the second memory cell to write to the logic state '0'—e.g., to a logic state opposite of the logic state stored by the other memory cell as a result of the sense operation. In some examples, the memory array may select either the first memory cell or the second memory cell for the writeback operation based on the logic state stored at the memory cell pair—e.g., the memory array may select the second memory cell if the memory cell pair stored a logic value '1' or the select the first memory cell if the memory cell pair stored a logic value '0.' For illustrative purposes, writing back the second memory cell coupled with the second digit line is shown. In examples where the first memory cell is selected, the first digit line voltage 540-*a* may go high instead. In other examples, the memory array may select half the memory array to program to the logic value '0' following the sense operation.

After the sense operation—e.g., after the first memory cell and the second memory cell move towards the first logic state—the memory array may select the second memory cell for a writeback operation. In such examples, the memory array may drive the second digit line voltage 540-*b* high. Based on the second digit line voltage 540-*b* being high and the plate line voltage 535 being low, the voltage across the second memory cell may be negative. Accordingly, the second memory cell may be written back to a second logic state '0.' The memory array may then drive the second digit line voltage 540-*b* back to ground and deselect the first memory cell and the second memory cell by driving the word line voltage 530 to ground—e.g., deactivate the first switching component and the second switching component. By utilizing the sense technique described herein, the memory array may reduce the likelihood of a sensing error and reduce a duration to perform the sensing operation and writeback.

Figure 6:
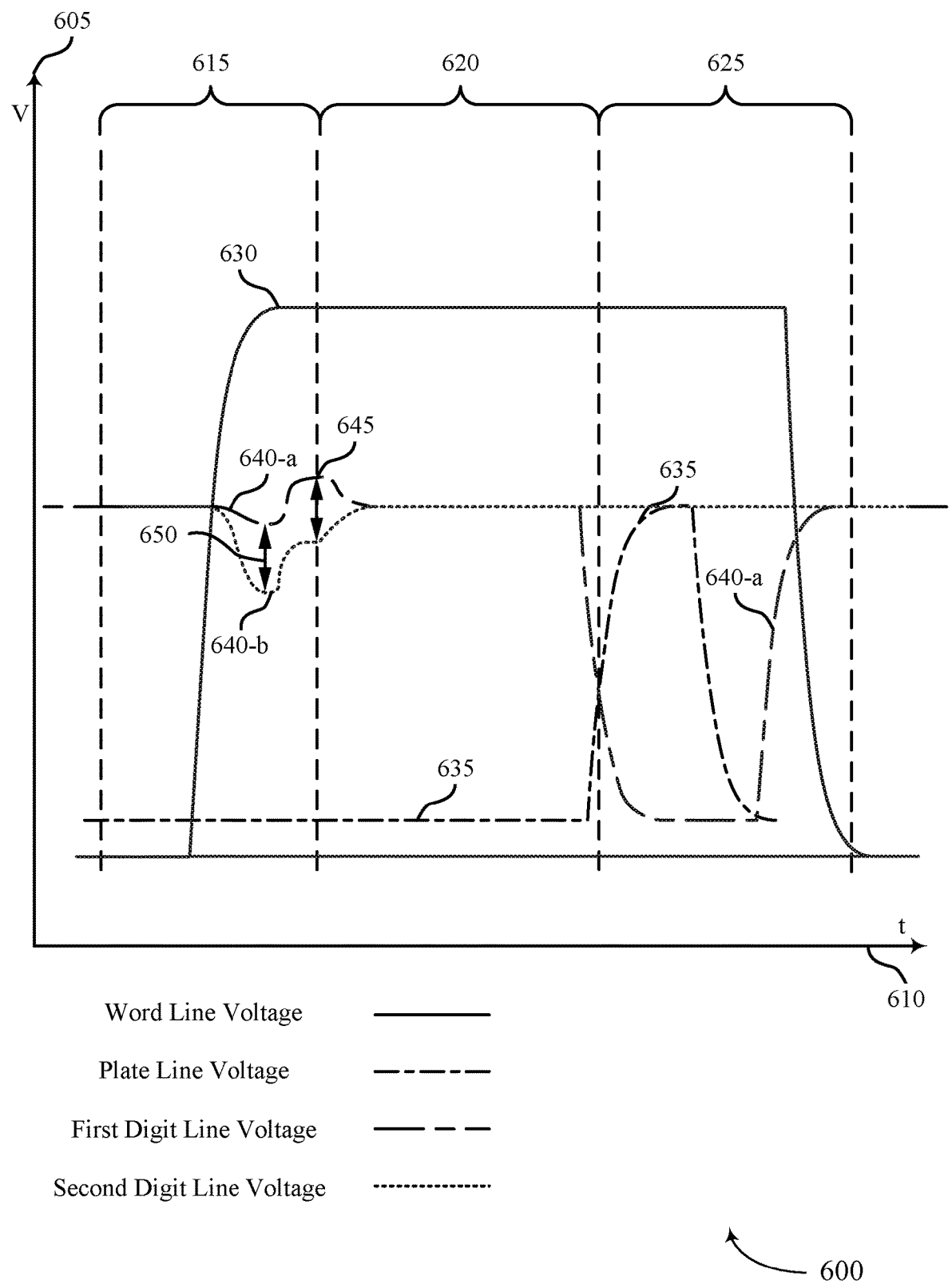
FIG. 6 illustrates an example of a timing diagram that supports apparatus for differential memory cells in accordance with examples as disclosed herein.

FIG. 6 illustrates an example of a timing diagram 600 that supports apparatus for differential memory cells in accordance with examples as disclosed herein. Timing diagram 600 includes a voltage axis 605 and a time axis 610 and may represent at least a portion of a read operation and a write back operation. The voltages of various components as a function of time are also represented on timing diagram 600. For example, timing diagram includes a word line voltage 630, a plate line voltage 635, a first digit line voltage 640-a and a second digit line voltage 640-b which may be examples of word line voltage 530, a plate line voltage 535, a first digit line voltage 540-a and a second digit line voltage 540-b as described with reference to FIG. 5. Timing diagram 600 may result from operating memory array 200 as described with reference to FIG. 2, and the following discussion is in the context of components depicted in FIG. 2. Additionally, timing diagram 600 may illustrate a first duration 625 that is before a sensing operation occurs, a second duration 620 associated with sensing a logic state of the memory cell pair, and a third duration 625 associated with a writeback operation of one memory cell of the memory cell pair.

As discussed above, a sensing technique for operating a ferroelectric memory cell pair may comprise keeping a voltage of the digit line pair high and a voltage of the plate line low during a sensing operation. In such examples, the voltages applied may cause the memory cell to move towards a logic state '0'. As illustrated in FIG. 6, a first digit line voltage 640-a and a second digit line voltage 640-b may be kept high (e.g., at an idle voltage) before an access operation is performed.

At a time 615, a local memory controller may select a memory cell pair for a read operation. In such examples, a word line voltage 630 may be applied to a word line to select the first memory cell and the second memory cell. A plate line voltage 635 may remain at a ground voltage. A pair of shunt transistors (e.g., transistor pair 270 as described with reference to FIG. 2) may be deactivated to isolate the plate line from the first digit line and the second digit line. Accordingly, the first memory cell may transfer charge to the first digit line and decrease the first digit line voltage 640-a and the second memory cell may transfer charge to the second digit line and decrease the second digit line voltage 640-b. In some examples, to improve a sense window—e.g., a difference between the first digit line voltage 540-a and the second digit line voltage 540-b—a first capacitor coupled with the first digit line and a sense component (e.g., sense component 255 as described with reference to FIG. 2) and a second capacitor coupled with the second digit line and the sense component may be activated at 650. In such examples, the first digit line voltage 640-a and the second digit line voltage 640-b may be pulled up—e.g., the first digit line voltage 640-a may be pulled to a voltage higher than the idle voltage of the first digit line 540-a. In some examples, the pull up of the first digit line voltage 540-a and the second digit line voltage 540-b may occur simultaneously with the sense component being activated at 520. The memory array may also drive a column select line to couple the first digit line and the second digit line to the global digit lines and the sense component.

At 620, the memory array may perform a sense operation. For example, at 620 the sense component may be activated and determine a logic state of the memory cell pair based on a difference between the first digit line voltage 640-a and the second digit line voltage 640-b. After the sense component has determined the logic state of the memory cell pair, the first digit line voltage 640-a and the second digit line voltage 640-b may be drive to the idle voltage again. Because the first digit line voltage 640-a and the second digit line voltage 640-b is high and the plate line voltage 635 is low, the voltage across the first memory cell and second memory cell may be negative—e.g., the first memory cell and the second memory cell may move toward a logic state '0.'

At 625, the memory array may perform a write back operation. For example, the memory array may select either the first memory cell or the second memory cell to write to a logic state '1—e.g., to a logic state opposite of the logic state stored by the other memory cell as a result of the sense operation. In some examples, the memory array may select either the first memory cell or the second memory cell for the writeback operation based on the logic state stored at the memory cell pair—e.g., the memory array may select the second memory cell if the memory cell pair stored a logic value '1' or the select the first memory cell if the memory cell pair stored a logic value '0.' For illustrative purposes, writing back the first memory cell coupled with the first digit line is shown. In examples where the second memory cell is selected, the second digit line voltage 640-b may go low instead. In other examples, the memory array may select half the memory array to program to the logic value '1' following the sense operation.

After the sense operation—e.g., after the first memory cell and the second memory cell move towards the logic state '0'—the memory array may select the first memory cell for a write back operation. In such examples, the memory array may drive the first digit line voltage 640-a to the ground voltage. The memory array may also drive a plate selection line (e.g., plate selection line 275) to apply a voltage to the plate line 635. The voltage may be applied to the plate until a threshold plate line voltage 635 is achieved. Based on the first digit line voltage 640-a being low and the plate line voltage 535 being high, the voltage across the first memory cell may be positive. Accordingly, the first memory cell may be written back to the logic state '1.' The memory array may then drive the first digit line voltage 640-a back to the idle voltage, the plate line voltage 635 to the ground voltage, and deselect the first memory cell and the second memory cell by driving the word line voltage 630 to ground—e.g., deactivate the first switching component and the second switching component. The first digit line voltage 640-a and the second digit line voltage 640-b may stay high following the write back operation and time 625. By utilizing the sense technique described herein, the memory array may reduce the imprinting effects on memory cells.

Figure 7:
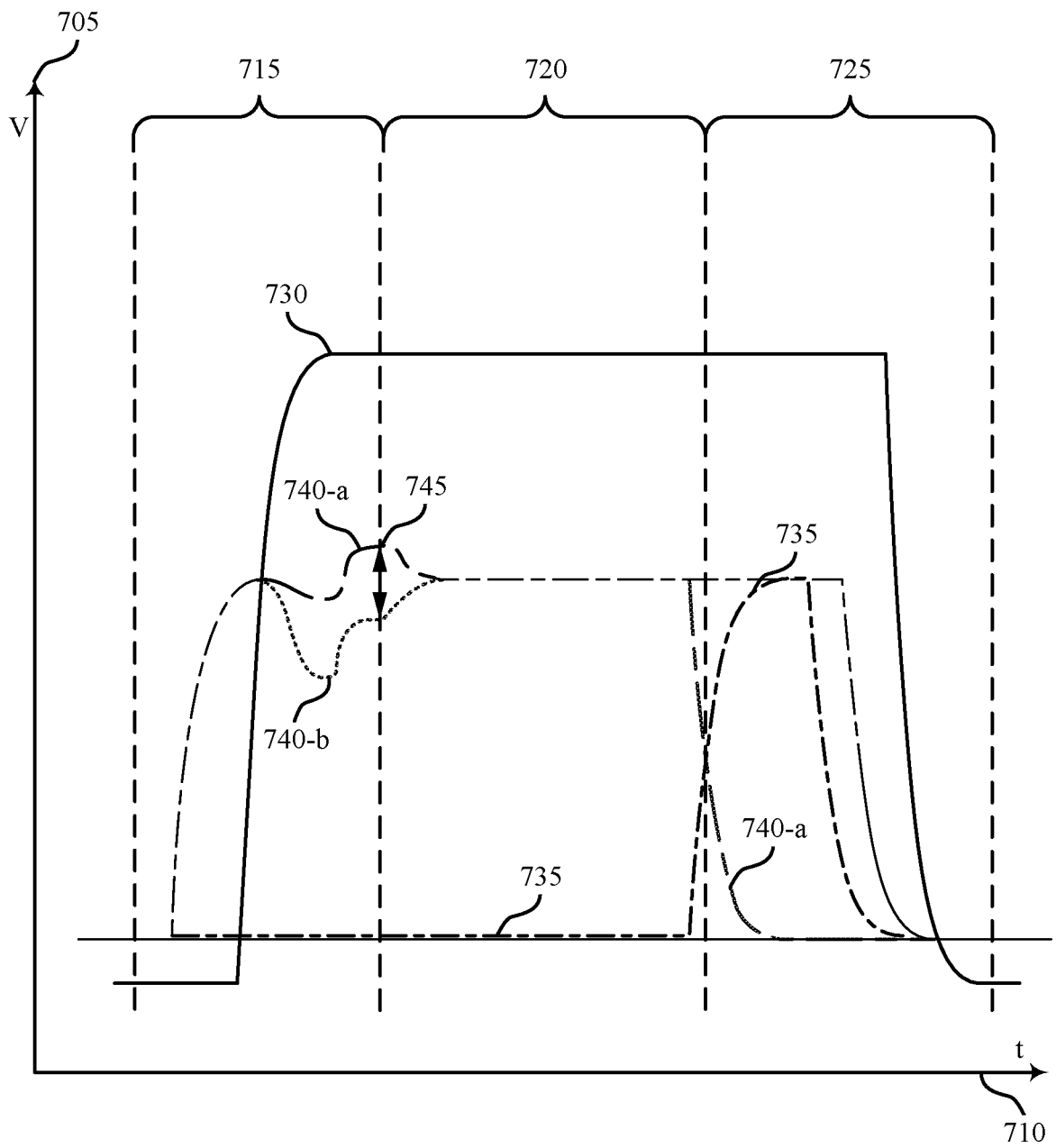
FIG. 7 illustrates an example of a timing diagram that supports apparatus for differential memory cells in accordance with examples as disclosed herein.

FIG. 7 illustrates an example of a timing diagram 700 that supports apparatus for differential memory cells in accordance with examples as disclosed herein. Timing diagram 700 includes a voltage axis 705 and a time axis 710 and may represent at least a portion of a read operation and a write back operation. The voltages of various components as a function of time are also represented on timing diagram 700. For example, timing diagram includes a word line voltage 730, a plate line voltage 735, a first digit line voltage 740-a and a second digit line voltage 740-b which may be examples of word line voltage 630, a plate line voltage 635, a first digit line voltage 640-a and a second digit line voltage 640-b as described with reference to FIG. 5. Timing diagram 700 may result from operating memory array 200 as described with reference to FIG. 2, and the following discussion is in the context of components depicted in FIG. 2. Additionally, timing diagram 700 may illustrate a first duration 715 that is before a sensing operation occurs, a second duration 720 associated with sensing a logic state of the memory cell pair, and a third duration 725 associated with a writeback operation of one memory cell of the memory cell pair.

In some examples, timing diagram 700 may illustrate a sensing technique for operating a ferroelectric memory cell pair may comprise keeping a voltage of the digit line pair high and a voltage of the plate line low during a sensing operation. In such examples, the voltages applied may cause the memory cell to move towards a logic state '0'. In some examples, the timing diagram 700 may illustrate a sensing scheme similar to timing diagram 600. In timing diagram 700, a digit line voltage 740-*a* and digit line voltage 740-*b* may be kept at a ground voltage before an access operation. Based on a memory cell pair being selected for an access operation, the first digit line voltage 740-*a* and the second digit line voltage 740-*b* may be driven to a high voltage (e.g., to an idle voltage as described with reference to FIG. 6). After the first digit line voltage 740-*a* and the second digit line voltage 740-*b* is driven high, the timing diagram may follow the steps and process regarding 715, 720, and 725 as described with reference to FIG. 6—e.g., to sense the memory cell pair and writeback a logic value '1' to one memory cell of the memory cell pair. In one example, after the writeback operation, the first digit line voltage 740-*a* and the second digit line voltage 740-*b* may be driven back to the ground voltage. That is, timing diagram 700 illustrates maintaining the first digit line voltage 740-*a* and the second digit line voltage 740-*b* at the ground voltage when an access operation is not being performed instead of an idle voltage as described with reference to FIG. 6. Accordingly, the memory array may conserve additional power compared with other examples when performing a sensing scheme as illustrated in FIG. 7.

It should be noted that the processes or timings described herein are possible implementations, and that the operations and the steps may be rearranged or otherwise modified and that other implementations are possible. Furthermore, portions from two or more of the processes or timings may be combined.

An apparatus is described. The apparatus may include a pair of memory cells including a first memory cell and a second memory cell, a word line coupled with the pair of memory cells, a plate line coupled with the pair of memory cells, a first digit line coupled with the first memory cell and a sense amplifier, a second digit line coupled with the second memory cell and the sense amplifier, and a select line configured to couple the first digit line and the second digit line with the sense amplifier.

In some examples, the apparatus may include a first transistor coupled with the first digit line and the sense amplifier and a second transistor coupled with the second digit line and the sense amplifier.

In some examples, the apparatus may include activate the first transistor to couple the first digit line to the sense amplifier and activate the second transistor to couple the second digit line to the sense amplifier.

In some examples, the apparatus may include a pair of transistors configured to equalize voltages between digit lines and plate lines for unselected memory cells, the pair of transistors including a first transistor coupled with the plate line and the first digit line and a second transistor coupled with the plate line and the second digit line and a second select line coupled with the first transistor and the second transistor and configured to deactivate the first transistor and the second transistor to isolate the plate line from the first digit line and the second digit line.

In some examples, the apparatus may include a second pair of memory cells including a third memory cell and a fourth memory cell, a second plate line coupled with the second pair of memory cells, a third digit line coupled with the third memory cell and the sense amplifier, a fourth digit line coupled with the fourth memory cell and the sense amplifier, and a second pair of transistors configured to equalize voltages between the third digit line, the fourth digit line, and the second plate line during at least a portion of an operation to access the pair of memory cells, the second pair of transistors including a third transistor coupled with the second plate line and the third digit line and configured to couple the second plate line with the third digit line and a fourth transistor coupled with the second plate line and the fourth digit line and configured to couple the second plate line with the fourth digit line.

In some examples, the apparatus may include a third select line coupled with the third transistor and the fourth transistor, where the third transistor couples the second plate line with the third digit line and the fourth transistor couples the second plate line with the fourth digit line based at least in part on the third select line activating the third transistor and the fourth transistor.

In some examples of the apparatus, a common signal may be communicated over the select line and the second select line, the common signal communicated over the second select line may be configured to deactivate the first transistor and the second transistor, and the common signal communicated over the select line may be configured to couple the first digit line and the second digit line with the sense amplifier.

In some examples, the apparatus may include a second select line coupled with the plate line and configured to supply a voltage to the plate line.

In some examples, the apparatus may include a second pair of memory cells including a third memory cell and a fourth memory cell, a second plate line coupled with the pair of memory cells, a third digit line coupled with the third memory cell, a fourth digit line coupled with the fourth memory cell, a second select line coupled with the plate line and configured to refrain from applying a voltage to the second plate line, and a circuit coupled with the plate line and a ground voltage, the circuit configured adjust a voltage of the second plate line to a voltage of the third digit line and a voltage of the fourth digit line.

In some examples of the apparatus, the circuit includes one or more components in a current mirror configuration.

In some examples of the apparatus, the circuit includes one or more components in a resistive transistor configuration.

Another apparatus is described. The apparatus may include a plurality of memory cell pairs, a memory cell pair of the plurality of memory cell pairs including a first memory cell and a second memory cell, a plurality of word lines coupled with the plurality of memory cell pairs, where a word line of the plurality of word lines is coupled with the first memory cell and the second memory cell of the memory cell pair, a plurality of plate lines coupled with the plurality of memory cell pairs, where a plate line of the plurality of plate lines is coupled with the first memory cell and the second memory cell of the memory cell pair, a plurality of digit line pairs coupled with the plurality of memory cell pairs, a first global digit line, and a second global digit line, a sense amplifier coupled with the first global digit line and the second global digit line, and a plurality of select lines, each select line of the plurality of select lines is configured to couple a digit line pair of the plurality of digit line pairs with the sense amplifier based at least in part on performing an access operation on the memory cell pair.

In some examples, the apparatus may include a plurality of transistor pairs coupled with the plurality of digit line pairs, where a transistor pair of the plurality of transistor pairs includes a first transistor coupled with a first digit line of the digit line pair and the first global digit line, and a second transistor coupled with a second digit line of the digit line pair and the second global digit line.

In some examples, the apparatus may include activate the first transistor of the transistor pair to couple the first digit line of the digit line pair to the first global digit line based at least in part on performing the access operation on the memory cell pair and activate the second transistor of the transistor pair to couple the second digit line to the second global digit line based at least in part on performing the access operation on the memory cell pair.

In some examples, the apparatus may include a plurality of transistor pairs coupled with the plurality of plate lines and a digit line of each digit line pair and configured to equalize voltages between digit lines and plate lines for unselected memory cell pairs, where a transistor pair of the plurality of transistor pairs includes a first transistor coupled with a first digit line of the digit line pair and the plate line and a second transistor coupled with a second digit line of the digit line pair and the plate line and a second plurality of select lines, each select line of the second plurality of select lines coupled with the plurality of transistor pairs, where a second select line of the second plurality of select lines may be configured to deactivate the first transistor and the second transistor to isolate the first digit line and the second digit line from the plate line based at least in part on performing the access operation on the memory cell pair.

In some examples, the apparatus may include a second memory cell pair of the plurality of memory cell pairs including a third memory cell and a fourth memory cell, a second plate line of the plurality of plate lines coupled with the third memory cell and the fourth memory cell of the memory cell pair, a second digit line pair coupled with the second memory cell pair, a second transistor pair coupled with the second digit line pair, the transistor pair including a third transistor coupled with a third digit line of the second digit line pair and a fourth transistor coupled with a fourth digit line of the second digit line pair, and a third select line of the second plurality of select lines coupled with the second transistor pair, the third select line configured to activate the third transistor and the fourth transistor to couple the second digit line pair with the second plate line based at least in part on performing the access operation on the memory cell pair.

In some examples of the apparatus, the second select line of the second plurality of select lines may be configured to transmit a first signal having a first logic value to deactivate the transistor pair, and the select line of the plurality of select lines may be configured to transmit a second signal having the first logic value to couple the digit line pair with the sense amplifier.

In some examples, the apparatus may include a second plurality of select lines, each select line of the second plurality of select lines coupled with the plate line of the plurality of plate lines, a second select line coupled with the plate line and configured to supply a voltage to the plate line based at least in part on performing the access operation on the memory cell pair.

In some examples, the apparatus may include a second memory cell pair of the plurality of memory cell pairs including a third memory cell and a fourth memory cell, a second plate line of the plurality of plate lines coupled with the third memory cell and the fourth memory cell of the memory cell pair, a second digit line pair coupled with the second memory cell pair, a third select line of the second plurality of select lines coupled with the second plate line and configured to refrain from supplying a voltage to the second plate line, and a circuit coupled with the second plate line and a ground voltage, the circuit configured to adjust a voltage of the second plate line to a voltage of the second digit line pair based at least in part on performing the access operation on the memory cell pair.

In some examples of the apparatus, the circuit includes one or more components in a current mirror configuration.

In some examples of the apparatus, the circuit includes one or more components in a resistive transistor configuration.

Another apparatus is described. The apparatus may include a pair of memory cells including a first memory cell and a second memory cell and configured to collectively store a logic state, a word line coupled with the pair of memory cells, a plate line coupled with the pair of memory cells, a first digit line coupled with the first memory cell of the pair of memory cells, a second digit line coupled with the second memory cell of the pair of memory cells, a first transistor coupled with the first digit line and a sense amplifier, a second transistor coupled with the second digit line and the sense amplifier, and a column select line coupled with the first transistor and the second transistor and configured to couple the first digit line and the second digit line to the sense amplifier based at least in part on activating the first transistor and the second transistor.

In some examples of the apparatus, the sense amplifier may be configured to determine the logic state stored by the pair of memory cells based on a difference between a first voltage of the first digit line and a second voltage of the second digit line.

In some examples, the apparatus may include a first capacitor coupled with the first digit line and configured to supply a voltage to the first digit line based at least in part on activating the first transistor and a second capacitor coupled with the second digit line and configured to supply a second voltage to the second digit line based at least in part on activating the second transistor.

In some examples, the apparatus may include a third transistor coupled with the first memory cell, the word line, and the first digit line and a fourth transistor coupled with the second memory cell, the word line, and the second digit line, where the word line may be configured to activate the third transistor and the fourth transistor based at least in part on performing an access operation on the pair of memory cells.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow. \

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a pair of memory cells comprising a first memory cell and a second memory cell;
a word line coupled with the pair of memory cells;
a plate line coupled with the pair of memory cells;
a first digit line coupled with the first memory cell and a sense amplifier;
a second digit line coupled with the second memory cell and the sense amplifier;
a select line configured to couple the first digit line and the second digit line with the sense amplifier;
a pair of transistors configured to equalize voltages between digit lines and plate lines for unselected memory cells, the pair of transistors comprising a first transistor coupled with the plate line and the first digit line and a second transistor coupled with the plate line and the second digit line; and
a second select line coupled with the first transistor and the second transistor and configured to deactivate the first transistor and the second transistor to isolate the plate line from the first digit line and the second digit line.

2. The apparatus of claim 1, further comprising:
a first transistor coupled with the first digit line and the sense amplifier; and
a second transistor coupled with the second digit line and the sense amplifier.

3. The apparatus of claim 2, wherein to couple the first digit line and the second digit line with the sense amplifier, the select line is configured to:
activate the first transistor to couple the first digit line to the sense amplifier; and
activate the second transistor to couple the second digit line to the sense amplifier.

4. The apparatus of claim 1, further comprising:
a second pair of memory cells comprising a third memory cell and a fourth memory cell;
a second plate line coupled with the second pair of memory cells;
a third digit line coupled with the third memory cell and the sense amplifier;
a fourth digit line coupled with the fourth memory cell and the sense amplifier; and
a second pair of transistors configured to equalize voltages between the third digit line, the fourth digit line, and the second plate line during at least a portion of an operation to access the pair of memory cells, the second pair of transistors comprising a third transistor coupled with the second plate line and the third digit line and configured to couple the second plate line with the third digit line and a fourth transistor coupled with the second plate line and the fourth digit line and configured to couple the second plate line with the fourth digit line.

5. The apparatus of claim 4, further comprising:
a third select line coupled with the third transistor and the fourth transistor, wherein the third transistor couples the second plate line with the third digit line and the fourth transistor couples the second plate line with the fourth digit line based at least in part on the third select line activating the third transistor and the fourth transistor.

6. The apparatus of claim 1, wherein:
a common signal is communicated over the select line and the second select line;
the common signal communicated over the second select line is configured to deactivate the first transistor and the second transistor; and
the common signal communicated over the select line is configured to couple the first digit line and the second digit line with the sense amplifier.

7. The apparatus of claim 1, further comprising:
a third select line coupled with the plate line and configured to supply a voltage to the plate line.

8. The apparatus of claim 1, further comprising:
a second pair of memory cells comprising a third memory cell and a fourth memory cell;
a second plate line coupled with the pair of memory cells;
a third digit line coupled with the third memory cell;
a fourth digit line coupled with the fourth memory cell;

a third select line coupled with the plate line and configured to refrain from applying a voltage to the second plate line; and a circuit coupled with the plate line and a ground voltage, the circuit configured adjust a voltage of the second plate line to a voltage of the third digit line and a voltage of the fourth digit line.

9. The apparatus of claim 8, wherein the circuit comprises one or more components in a current mirror configuration.

10. The apparatus of claim 8, wherein the circuit comprises one or more components in a resistive transistor configuration.

11. An apparatus, comprising:
a plurality of memory cell pairs, a memory cell pair of the plurality of memory cell pairs comprising a first memory cell and a second memory cell;
a plurality of word lines coupled with the plurality of memory cell pairs, wherein a word line of the plurality of word lines is coupled with the first memory cell and the second memory cell of the memory cell pair;
a plurality of plate lines coupled with the plurality of memory cell pairs, wherein a plate line of the plurality of plate lines is coupled with the first memory cell and the second memory cell of the memory cell pair;
a plurality of digit line pairs coupled with the plurality of memory cell pairs, a first global digit line, and a second global digit line;
a sense amplifier coupled with the first global digit line and the second global digit line;
a plurality of select lines, wherein a select line of the plurality of select lines is configured to couple a digit line pair of the plurality of digit line pairs with the sense amplifier based at least in part on performing an access operation on the memory cell pair;
a plurality of transistor pairs coupled with the plurality of plate lines and a digit line of each digit line pair and configured to equalize voltages between digit lines and plate lines for unselected memory cell pairs, wherein a transistor pair of the plurality of transistor pairs comprises a first transistor coupled with a first digit line of the digit line pair and the plate line and a second transistor coupled with a second digit line of the digit line pair and the plate line; and
a second plurality of select lines, each select line of the second plurality of select lines coupled with the plurality of transistor pairs, wherein a second select line of the second plurality of select lines is configured to deactivate the first transistor and the second transistor to isolate the first digit line and the second digit line from the plate line based at least in part on performing the access operation on the memory cell pair.

12. The apparatus of claim 11, further comprising:
the plurality of transistor pairs coupled with the plurality of digit line pairs, wherein a transistor pair of the plurality of transistor pairs comprises a first transistor coupled with a first digit line of the digit line pair and the first global digit line, and a second transistor coupled with a second digit line of the digit line pair and the second global digit line.

13. The apparatus of claim 12, wherein to couple the digit line pair with the sense amplifier, the select line is configured to:
activate the first transistor of the transistor pair to couple the first digit line of the digit line pair to the first global digit line based at least in part on performing the access operation on the memory cell pair; and
activate the second transistor of the transistor pair to couple the second digit line to the second global digit line based at least in part on performing the access operation on the memory cell pair.

14. The apparatus of claim 11, further comprising:
a second memory cell pair of the plurality of memory cell pairs comprising a third memory cell and a fourth memory cell;
a second plate line of the plurality of plate lines coupled with the third memory cell and the fourth memory cell of the memory cell pair;
a second digit line pair coupled with the second memory cell pair;
a second transistor pair coupled with the second digit line pair, the transistor pair comprising a third transistor coupled with a third digit line of the second digit line pair and a fourth transistor coupled with a fourth digit line of the second digit line pair; and
a third select line of the second plurality of select lines coupled with the second transistor pair, the third select line configured to activate the third transistor and the fourth transistor to couple the second digit line pair with the second plate line based at least in part on performing the access operation on the memory cell pair.

15. The apparatus of claim 11, wherein:
the second select line of the second plurality of select lines is configured to transmit a first signal having a first logic value to deactivate the transistor pair, and
the select line of the plurality of select lines is configured to transmit a second signal having the first logic value to couple the digit line pair with the sense amplifier.

16. The apparatus of claim 11, further comprising:
third plurality of select lines, each select line of the second plurality of select lines coupled with the plate line of the plurality of plate lines, a second select line coupled with the plate line and configured to supply a voltage to the plate line based at least in part on performing the access operation on the memory cell pair.

17. The apparatus of claim 16, further comprising:
a second memory cell pair of the plurality of memory cell pairs comprising a third memory cell and a fourth memory cell;
a second plate line of the plurality of plate lines coupled with the third memory cell and the fourth memory cell of the memory cell pair;
a second digit line pair coupled with the second memory cell pair;
a third select line of the second plurality of select lines coupled with the second plate line and configured to refrain from supplying a voltage to the second plate line; and
a circuit coupled with the second plate line and a ground voltage, the circuit configured to adjust a voltage of the second plate line to a voltage of the second digit line pair based at least in part on performing the access operation on the memory cell pair.

18. The apparatus of claim 17, wherein the circuit comprises one or more components in a current mirror configuration.

19. The apparatus of claim 17, wherein the circuit comprises one or more components in a resistive transistor configuration.

20. An apparatus, comprising:
a pair of memory cells comprising a first memory cell and a second memory cell and configured to collectively store a single logic state;

a word line coupled with the pair of memory cells;

a plate line coupled with the pair of memory cells;

a first digit line coupled with the first memory cell of the pair of memory cells;

a second digit line coupled with the second memory cell of the pair of memory cells;

a first transistor coupled with the first digit line and a sense amplifier;

a second transistor coupled with the second digit line and the sense amplifier;

a column select line coupled with the first transistor and the second transistor and configured to couple the first digit line and the second digit line to the sense amplifier based at least in part on activating the first transistor and the second transistor;

a pair of transistors configured to equalize voltages between digit lines and plate lines for unselected memory cells, the pair of transistors comprising a third transistor coupled with the plate line and the first digit line and a fourth transistor coupled with the plate line and the second digit line; and a second column select line coupled with the third transistor and the fourth transistor and configured to deactivate the third transistor and the fourth transistor to isolate the plate line from the first digit line and the second digit line.

21. The apparatus of claim 20, wherein the sense amplifier is configured to determine the single logic state stored by the pair of memory cells based on a difference between a first voltage of the first digit line and a second voltage of the second digit line.

22. The apparatus of claim 20, further comprising:

a first capacitor coupled with the first digit line and configured to supply a voltage to the first digit line based at least in part on activating the first transistor; and a second capacitor coupled with the second digit line and configured to supply a second voltage to the second digit line based at least in part on activating the second transistor.

23. The apparatus of claim 20, further comprising:

a fifth transistor coupled with the first memory cell, the word line, and the first digit line; and a sixth transistor coupled with the second memory cell, the word line, and the second digit line, wherein the word line is configured to activate the third transistor and the fourth transistor based at least in part on performing an access operation on the pair of memory cells.

* * * * *